United States Patent
Zhuang et al.

(10) Patent No.: US 7,042,705 B2
(45) Date of Patent: May 9, 2006

(54) SIDEWALL STRUCTURE AND METHOD OF FABRICATION FOR REDUCING OXYGEN DIFFUSION TO CONTACT PLUGS DURING CW HOLE REACTIVE ION ETCH PROCESSING

(75) Inventors: Haoren Zhuang, Tokyo-to (JP); Ulrich Egger, Kanagawa-ken (JP); Kazuhiro Tomioka, Kanagawa-ken (JP); Jingyu Lian, Tokyo-to (JP); Nicolas Nagel, Kanagawa-ken (JP); Andreas Hilliger, Kanagawa-ken (JP); Gerhard Beitel, Kanagawa-ken (JP)

(73) Assignees: Infineon Technologies AG, (DE); Kabushiki Kaisha Toshiba, (JP)

( * ) Notice: Subject to any disclaimer, the term of this patent is extended or adjusted under 35 U.S.C. 154(b) by 126 days.

(21) Appl. No.: 10/356,690

(22) Filed: Jan. 30, 2003

(65) Prior Publication Data

US 2004/0149477 A1     Aug. 5, 2004

(51) Int. Cl.
    *H01G 4/10*     (2006.01)
(52) U.S. Cl. ............ 361/303; 361/302; 361/305; 361/306.1; 361/306.3; 361/321.1; 438/253; 438/254; 257/295; 257/296
(58) Field of Classification Search ........ 361/306.1, 361/306.3, 321.1, 302, 303, 305; 438/393, 438/396, 397, 253–254; 275/295–296
See application file for complete search history.

(56) References Cited

U.S. PATENT DOCUMENTS

| | | |
|---|---|---|
| 5,585,998 A | 12/1996 | Kotecki et al. |
| 5,679,980 A | 10/1997 | Summerfelt |
| 6,043,529 A | 3/2000 | Hartner et al. |
| 6,261,849 B1 | 7/2001 | Lee |
| 6,333,547 B1 | 12/2001 | Tanaka et al. |
| 6,339,007 B1 * | 1/2002 | Wang et al. ........... 438/393 |
| 6,423,999 B1 | 7/2002 | Matsuki |
| 6,566,190 B2 * | 5/2003 | Lee et al. ............ 438/242 |
| 2001/0024868 A1 | 9/2001 | Nicolas et al. |

FOREIGN PATENT DOCUMENTS

EP      1271624      1/2003

OTHER PUBLICATIONS

International Search Report, Mailing Date Dec. 7, 2004.

* cited by examiner

*Primary Examiner*—Nguyen T. Ha
(74) *Attorney, Agent, or Firm*—Lerner, David, Littenberg, Krumholz & Mentlik, LLP

(57) ABSTRACT

The present invention provides a sidewall oxygen diffusion barrier and a method for fabricating the sidewall oxygen diffusion barrier that reduces the diffusion of oxygen into contact plugs during a CW hole reactive ion etch of a ferroelectric capacitor of an FeRAM device. In one embodiment the sidewall barrier is formed from a substrate fence. In another embodiment, the sidewall barrier is formed by etching back an oxygen barrier.

12 Claims, 8 Drawing Sheets

SIDEWALL STRUCTURE AND METHOD OF FABRICATION FOR REDUCING OXYGEN DIFFUSION TO CONTACT PLUGS DURING CW HOLE REACTIVE ION ETCH PROCESSING

FIELD OF THE INVENTION

The present invention relates to reducing oxidation of contact plugs and relates more particularly to structures and processes for reducing oxygen diffusion through bottom electrode fences during CW hole reactive ion etch processing.

BACKGROUND OF THE INVENTION

In prior-art COP (capacitor on plug) devices, contact plugs are often used as vertical interconnects between metal lines in multilevel interconnect schemes During processing of a CW (contact window) hole opening using an oxide reactive ion etch (RIE), oxygen forms in the TEOS (Tetraethyl Orthosilicate) hardmask covering the capacitor. An Ir (Iridium) based barrier is often positioned between a bottom electrode (BE) and the TEOS substrate to block oxygen from causing damage when it diffuses to the plug. However, TEOS residues of the etching process ("fences") can form during RIE processing of the bottom electrode. These fences allow the oxygen to diffuse from the TEOS hardmask to the plugs during the CW hole RIE processing. This oxygen reacts with the material of the plug, for example poly silicon or W (Tungsten), causing functional damage to the plug structure, in particular causing contact degradation.

One way to avoid this plug oxidization problem is to make the bottom electrode RIE process such that no oxygen-diffusion-allowing fences are formed. However, this is difficult to achieve in typical processes where the hardmask covering the bottom electrode during bottom electrode RIE processing has a steep taper angle.

Another way to avoid this plug oxidization problem is to remove the TEOS fences after they are formed. However, this is a difficult and complex process.

FIG. 1 illustrates the above problem as found in a ferroelectric capacitor device 11 of the prior art. A ferroelectric (FE) capacitor 13 includes a ferroelectric layer 15 sandwiched between a bottom electrode 17 and a top electrode 19. The ferroelectric layer 15 can include PZT, SBT, or BLT, for example. The top electrode 19 is covered with a TEOS hardmask 21 used during patterning of the top electrode. The TEOS hardmask 21 and capacitor 13 are also encapsulated by an $Al_2O_3$ oxygen barrier layer 22. The capacitor is covered by an additional TEOS hardmask 23 used during patterning of the bottom electrode 17. This additional TEOS hardmask 23 is encapsulated by an additional $Al_2O_3$ barrier layer 24.

A Ti glue-layer 25 serves to adhere the bottom electrode 17 to a TEOS substrate 27 of the FE capacitor 13. A plug 29 (made from poly silicon, for example) passes through the device 11 to form an electrical connection between an active region (not shown) and the bottom electrode 17. Between the Ti glue-layer 25 and the bottom electrode 17 can be barrier layers 31 of Ir (Iridium), $IrO_2$ (Iridium Oxide) or other materials for blocking oxygen diffusion. During the processing of the capacitor 13, oxygen RTA or other high temperature oxygen treatments are used. These barrier layers 31 stop the oxygen introduced from these processes from damaging the plug 29.

Metal fences 33 and TEOS fences 35 can be formed during the RIE processing of the bottom electrode 17. During processing of a CW hole opening 37 using an oxide RIE process, oxygen (schematically illustrated by the dots 39) enters the additional TEOS hardmask 23. As shown schematically by the dots 39, the oxygen travels from the additional TEOS hardmask 23, through the TEOS fence 35 and through the TEOS substrate 27 to the plug 29, causing damage to the plug 29. The oxygen can similarly pass to W-plugs causing damaging oxidation.

It would be desirable to have sidewall structures and sidewall forming processes for reducing the contact plug oxidization.

SUMMARY OF THE INVENTION

The present invention provides a sidewall oxygen diffusion barrier and method for fabricating the sidewall oxygen diffusion barrier for reducing oxygen diffusion to contact plugs during CW hole reactive ion etch processing of a ferroelectric capacitor of an FeRAM device. In one embodiment the sidewall barrier is formed from a substrate fence, while in another embodiment the sidewall barrier is formed by etching back an oxygen barrier. The invention includes a hardmask used for patterning an electrode formed on a substrate. A contact plug passes through the substrate and is electrically connected to the electrode. A barrier layer is between the electrode and the plug and reduces the diffusion to the plug of oxygen introduced during capacitor processing. A sidewall oxygen diffusion barrier extends from the hardmask to the barrier layer and forms an oxygen-tight seal with the barrier layer for reducing the diffusion of oxygen from the hardmask to the plug.

The present invention also includes a method for fabricating the sidewall oxygen diffusion barrier. The method includes forming a substrate having a contact plug passing therethrough for electrically connecting a bottom electrode of the capacitor to an underlying active layer; depositing over the substrate the bottom electrode including a barrier layer intermediate therebetween; depositing on the bottom electrode a hardmask; etching to pattern the bottom electrode using the hardmask; forming, during the etching step, a sidewall oxygen diffusion barrier extending from the hardmask to the barrier layer and forming an oxygen-tight seal with the barrier layer for reducing the diffusion of oxygen from the hardmask to the contact plug.

BRIEF DESCRIPTION OF THE FIGURES

Further preferred features of the invention will now be described for the sake of example only with reference to the following figures, in which.

DETAILED DESCRIPTION OF THE EMBODIMENTS

Figure 1:
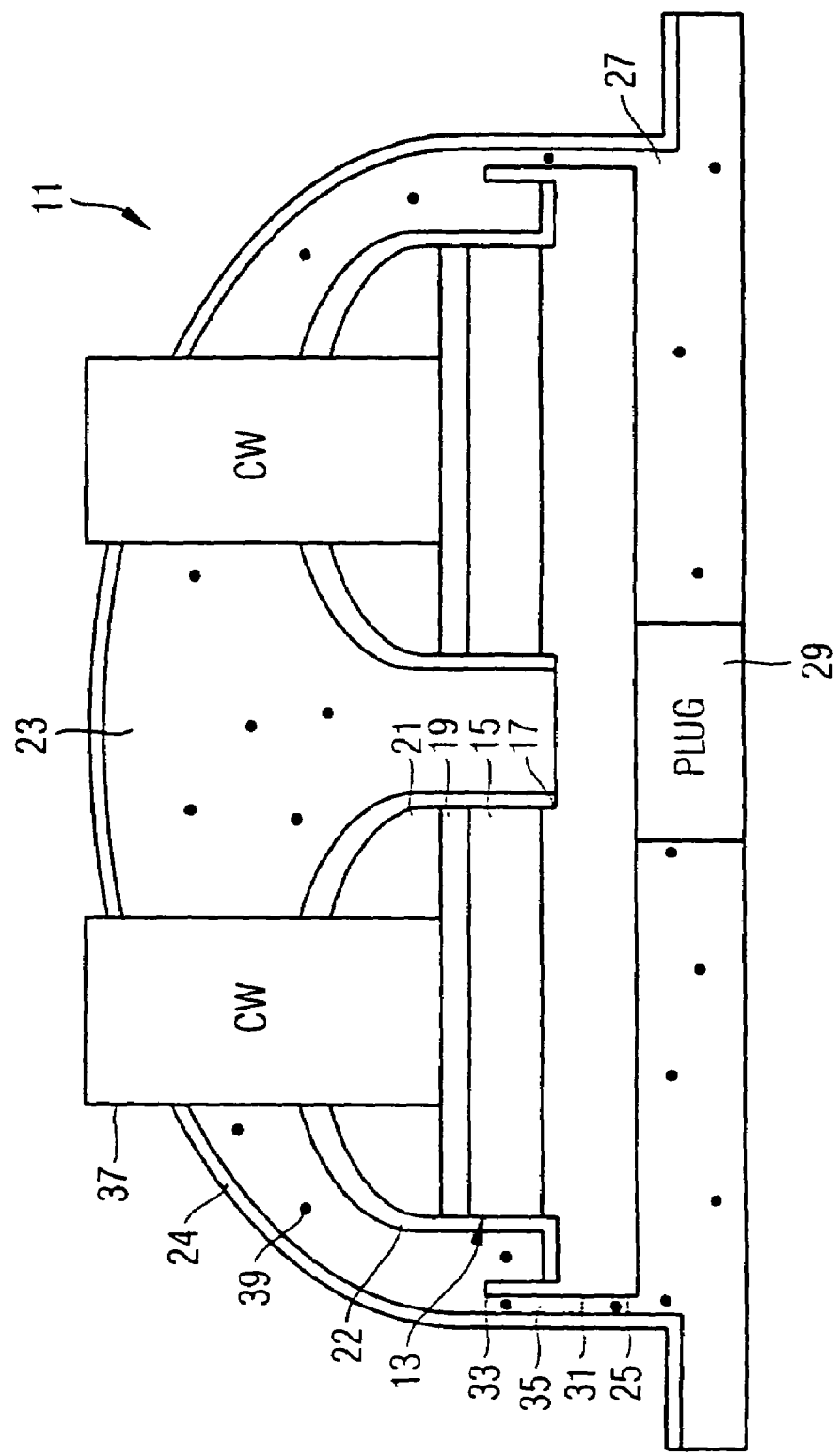
FIG. 1 shows a ferroelectric capacitor device of the prior art having fences through which oxygen diffuses.
Figure 2:
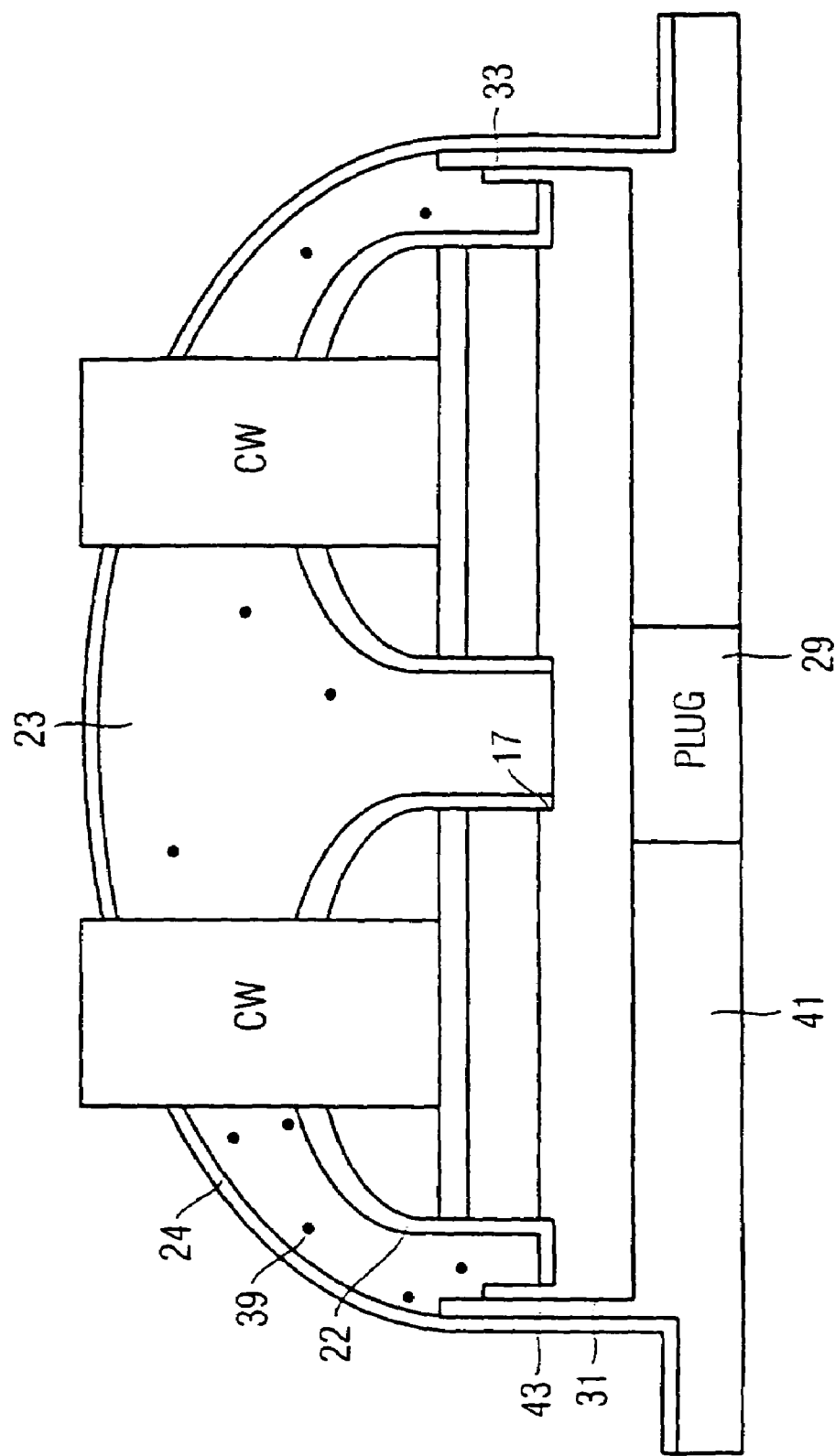
FIG. 2 shows a first embodiment of the invention wherein a sidewall oxygen diffusion barrier is formed from substrate fences to reduce oxidation of the plug.

FIG. 2 shows a first embodiment of the present invention for reducing oxidation of the plug 29. The prior-art TEOS substrate 27 illustrated in FIG. 1 is replaced with the substrate 41 composed of HCD Nitride (Hexachlorodisilane SiN). By using the HCD Nitride substrate 41, the resulting fences 43 formed during patterning of the bottom electrode 17 are composed of HCD Nitride, rather than TEOS as in the prior art. The HCD Nitride has better oxygen barrier performance than TEOS, thereby reducing the diffusion of the oxygen 39 from the TEOS hard mask 23 to the plug 29. Thus, rather than having the oxygen passing fences 35 of the prior art, the fences 43 of the present embodiment serve as sidewall oxygen diffusion barriers. These sidewall oxygen diffusion barriers extend from the TEOS hardmask 23 to the underlying oxygen barrier layers 31, forming an oxygen-tight seal with the oxygen barrier layers 31.

HCD Nitride is also superior to LP Nitride (low pressure Nitride) because it has better adhesion to metal barrier properties. HCD Nitride also shows special characteristics such as lower k and a high wet etch rate.

Figure 3:
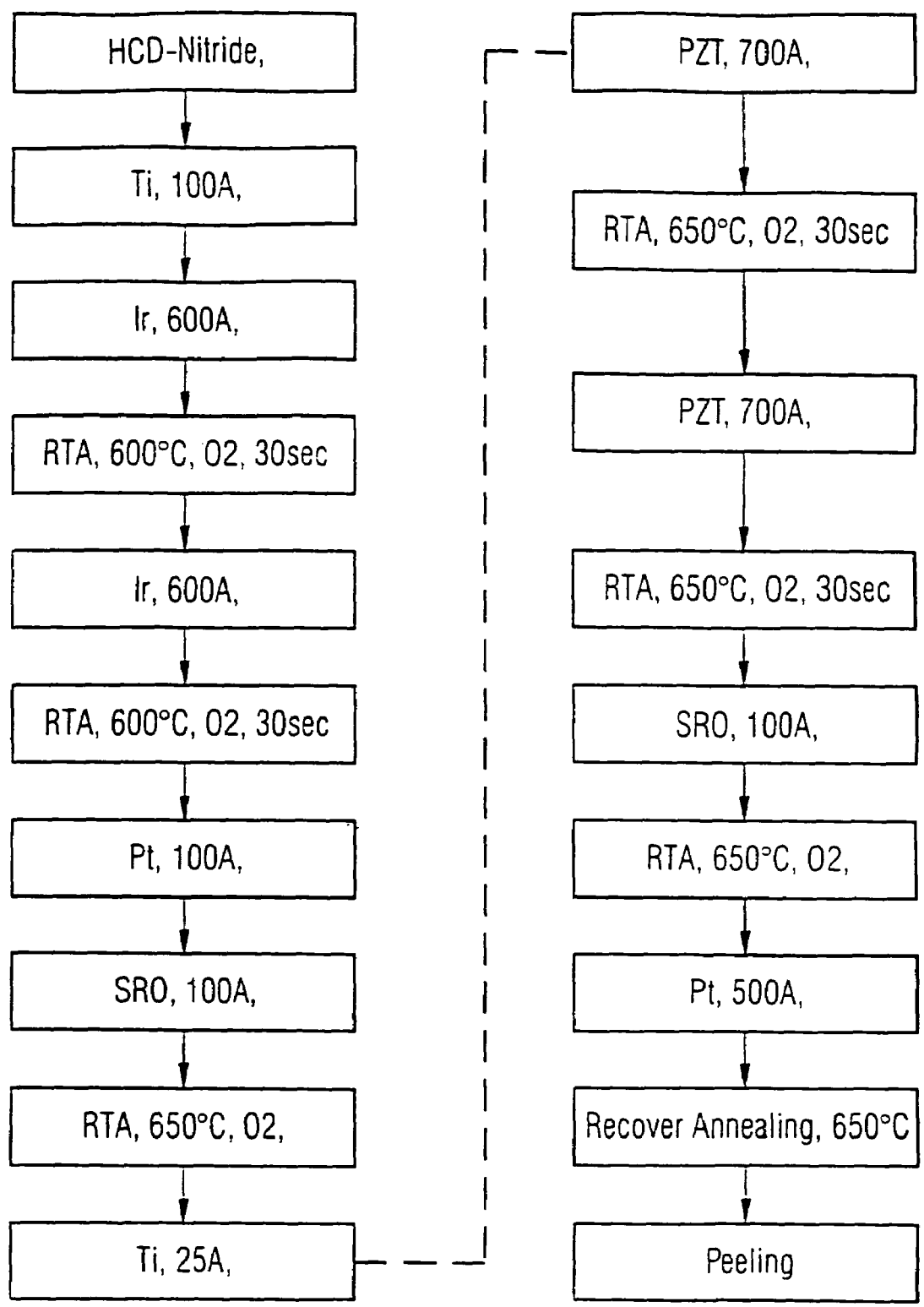
FIG. 3 is a flowchart showing the process for fabricating the embodiment of FIG. 2 using HCD Nitride with the capacitor barrier, capacitor layer structures and processes of the prior art.

FIG. 3 is a flowchart showing the process for using HCD Nitride with the capacitor barrier, capacitor layer structures and processes of the prior art. In the flowchart, references to O2 mean that the RTA process in performed in Oxygen, Also, the thickness are provided in unites of Angstroms (A). As a final step illustrated in FIG. 3, a peeling test was performed. Scanning Electron Microscope examination revealed that the resulting structure incorporating the HCD Nitride layer passed the peeling test.

Figure 4:
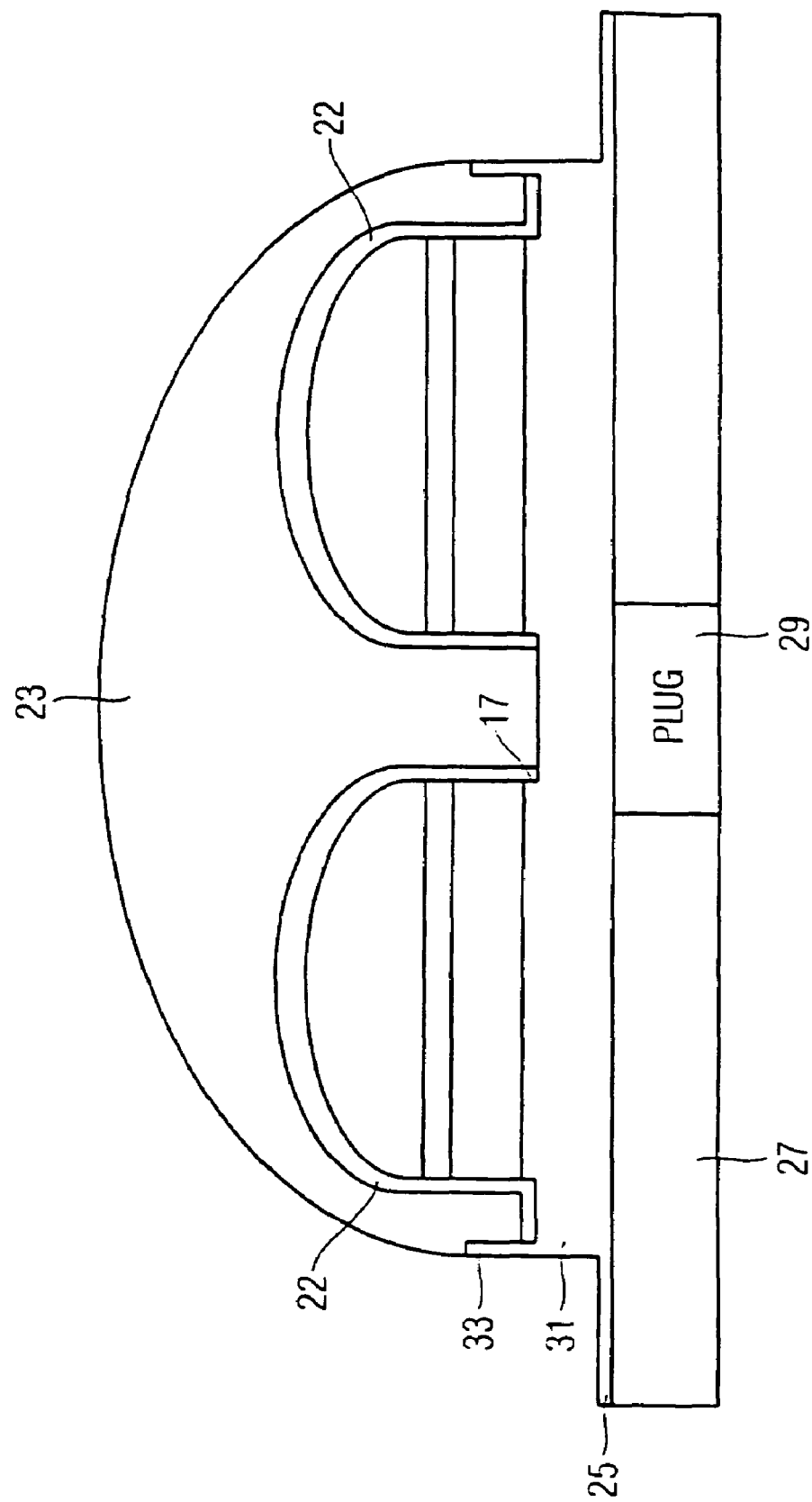
FIG. 4 illustrates the second embodiment during the etching of the bottom electrode wherein the etching is stopped before the etch frontier reaches the TEOS substrate.
Figure 5:
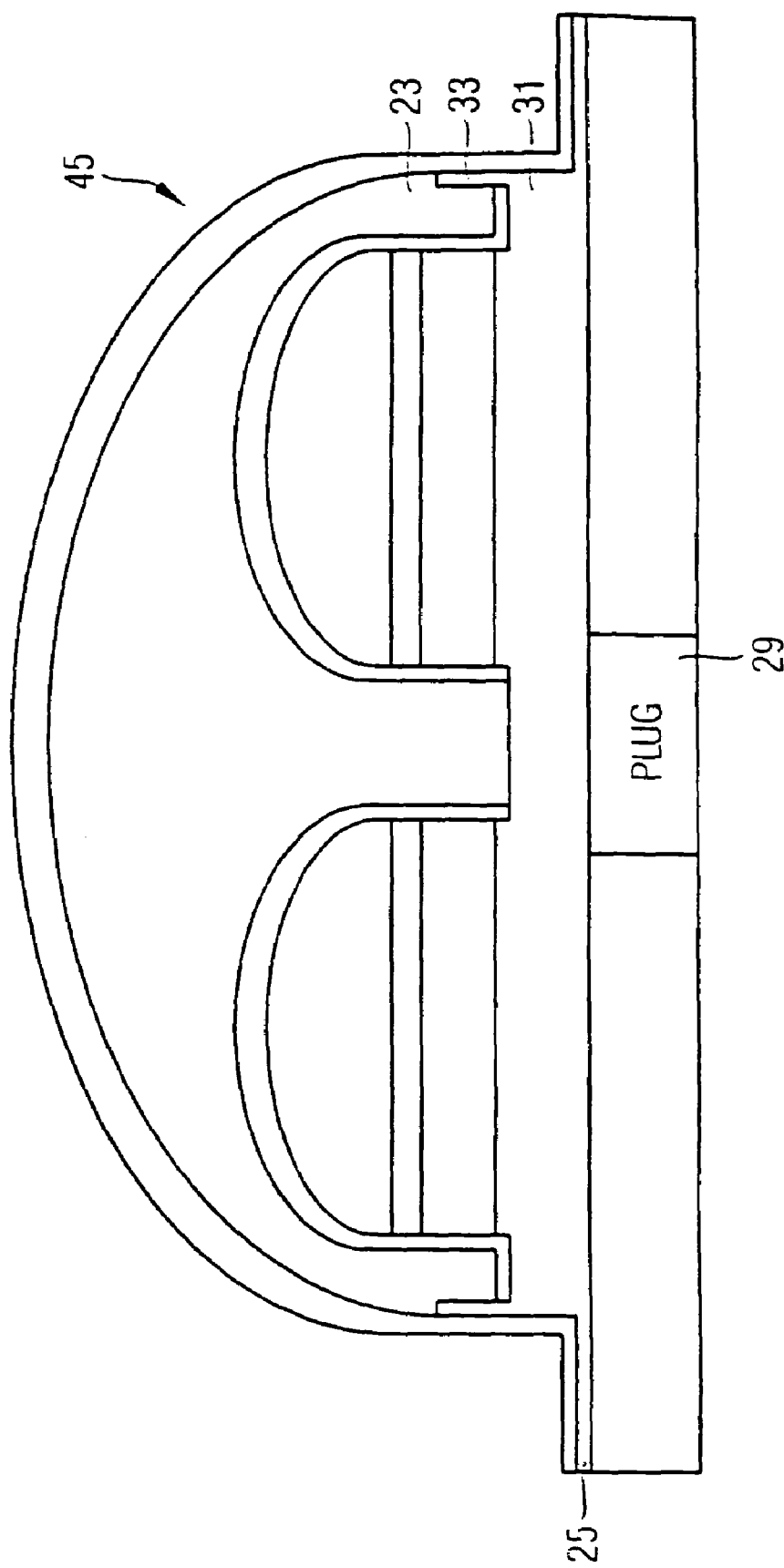
FIG. 5 shows an oxygen stopping cover layer deposited over the outer portions including the TEOS hardmask, metal fences, and remaining underlying layers such as the barrier layers and Ti glue-layer.
Figure 6:
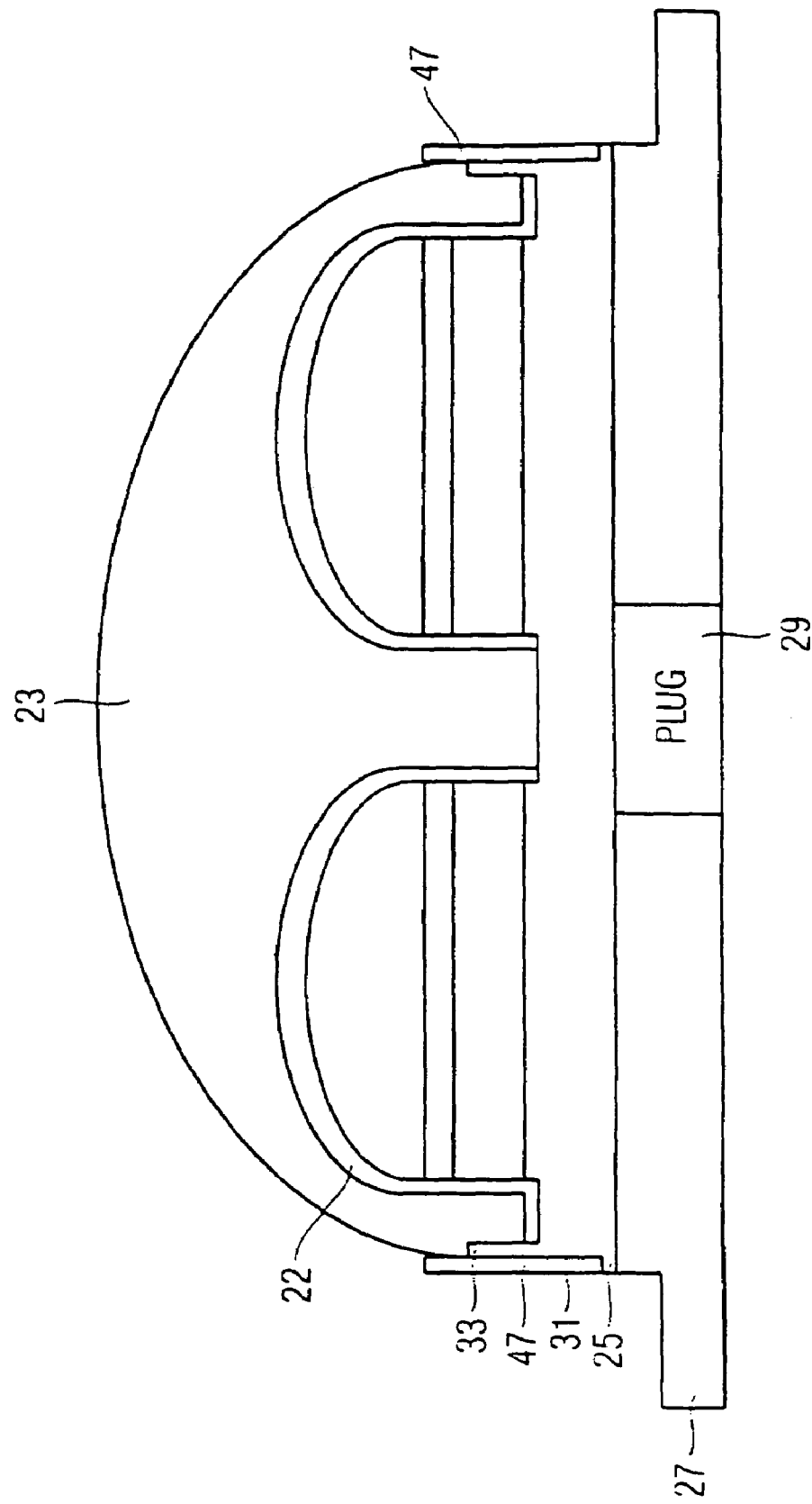
FIG. 6 illustrates an additional anisotropic RIE processing step of the second embodiment in which the etching is continued into the TEOS substrate and the oxygen stopping cover layer is etched-back to form a sidewall oxygen diffusion barrier.
Figure 7:
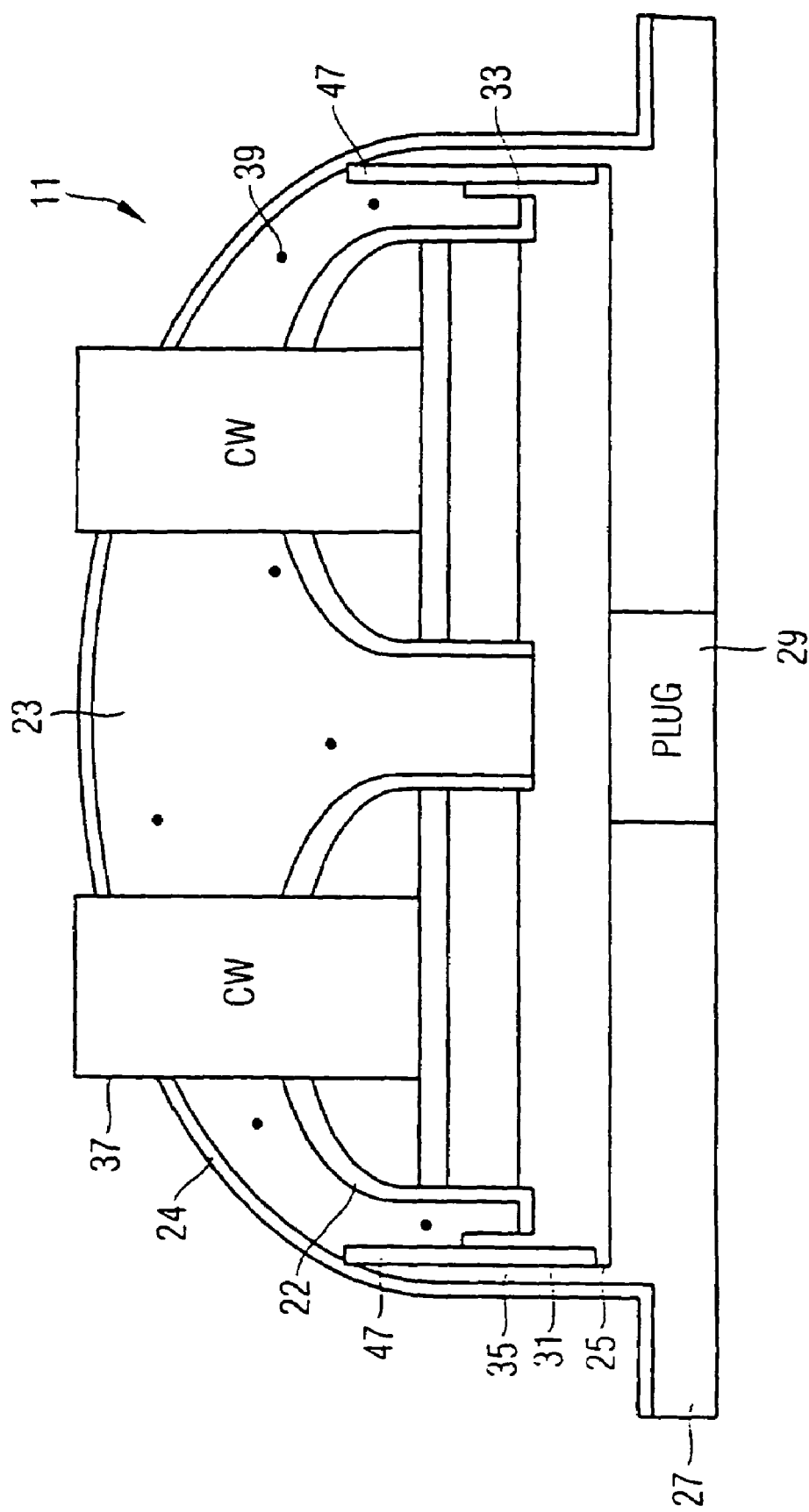
FIG. 7 shows the processed device with a sidewall oxygen diffusion barrier of the second embodiment for reducing oxidation of the plug.
Figure 8:
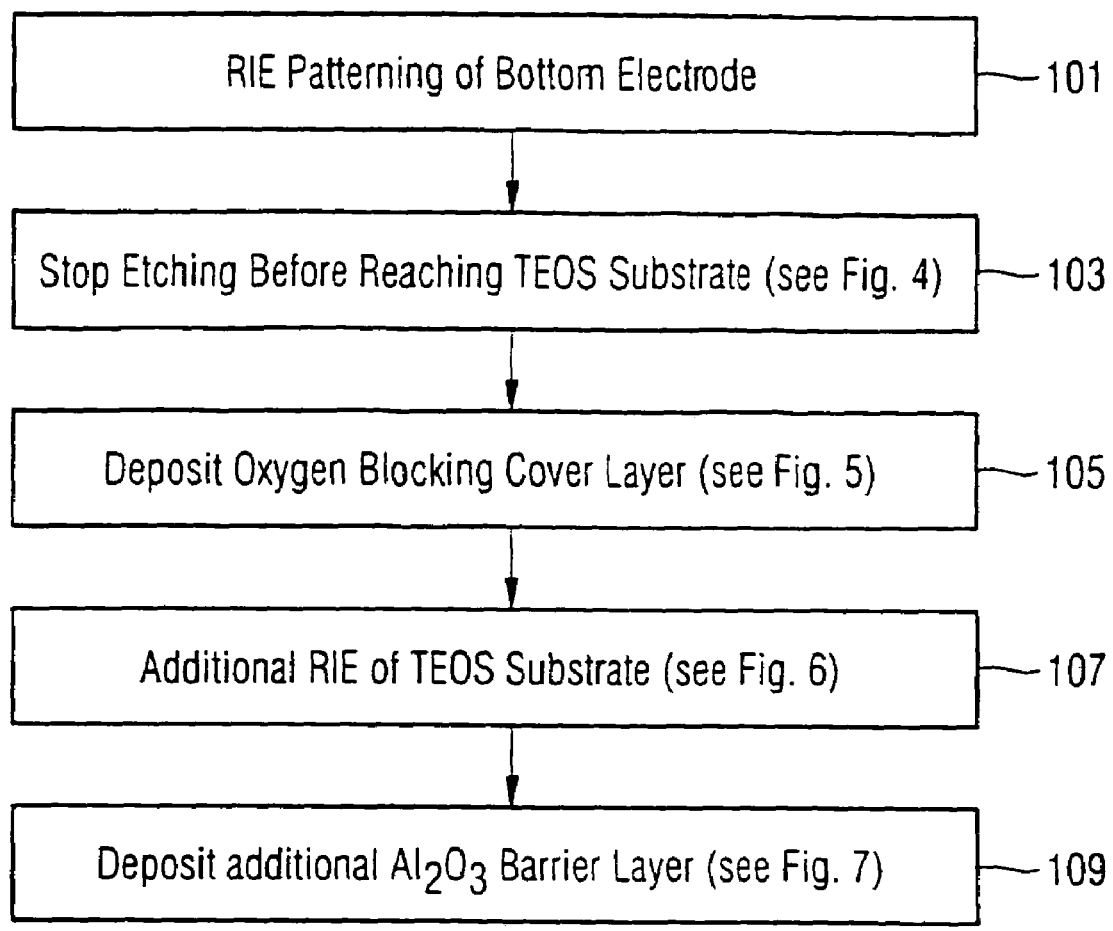
FIG. 8 is a flowchart showing the etch-back process for fabricating the second embodiment of FIG. 7.

FIGS. 4–6 show the device of the second embodiment of the present invention during the various processing steps resulting in the processed device of FIG. 7. The flowchart of FIG. 8 shows the method steps for fabricating the second embodiment. The flowchart of FIG. 8 starts with the step 101 of RIE patterning of the bottom electrode 17. Like the first embodiment of FIG. 2, the second embodiment results in a sidewall oxygen diffusion barrier 47 extending from the TEOS hardmask 23 to the underlying oxygen barrier layers 31, forming an oxygen-tight seal with the oxygen barrier layers 31 (see FIG. 7).

In the prior art of FIG. 1 and the first embodiment of FIG. 2, the initial etching of the bottom electrode continues all the way into the substrates 27 and 41, respectively, of the capacitors. This results in the fences 35, 43 formed from the respective TEOS and HCD Nitride materials. In the second embodiment, the RIE processing of the bottom electrode can etch into the underlying oxygen barrier layers 31 or Ti glue-layer 25, but the etch is stopped before the etch frontier reaches the TEOS layer 27 as illustrated in FIG. 4 and step 103 of FIG. 8. The metal fences 33 are formed during the bottom electrode etching.

Next, as shown in FIG. 5 and step 105 of FIG. 8, an oxygen stopping cover layer 45 is deposited over the outer portions including the TEOS hardmask 23, metal fences 33 and remaining underlying layers such as the barrier layers 31 and Ti glue-layer 25. The oxygen stopping cover layer 45 can be composed of a Nitride, such as HCD Nitride, or $Al_2O_3$, for example. The cover layer 45 can be deposited using PVD (physical vapor deposition), CVD (chemical vapor deposition) or ALD (atomic layer deposition) processes, for example.

As illustrated by step 107 of FIG. 8 and by FIG. 6, an additional RIE processing step (or continuation of the previous RIE processing step) is performed in which the etch is continued into the TEOS substrate 27. The RIE process is anisotropic, etching away more horizontally oriented portions of the oxygen stopping cover layer 45 while leaving more vertically oriented portions of the oxygen stopping cover layer 45 clinging to the TEOS hardmask 23, metal fences 33, or underlying layers The remaining more vertically oriented portions of the oxygen stopping cover layer become the oxygen barrier fence or sidewall oxygen diffusion barrier 47. In other words, the cover layer 45 is etched back to leave the sidewall oxygen diffusion barrier 47.

Finally, an additional $Al_2O_3$ barrier layer 24 is deposited around the TEOS hardmask 23 and sidewall barrier 47 at step 109 of FIG. 8. FIG. 8 shows a device of the present invention after processing. Once again, during processing of the CW hole opening 37 using an oxide RIE process, oxygen 39 enters the additional TEOS hardmask 23. The sidewall barrier 47 forms an oxygen-tight seal with the barrier layer 24 as well as with the oxygen barrier layers 31 to form a continuous encapsulation barrier for reducing the oxygen 39 passing from the hardmask 23 to the plug 29.

FIG. 7 differs slightly from FIG. 6 in that it shows additional TEOS fences 35 formed during the RIE processing of the cover layer 45. Even with these fences 35, due to the sidewall barrier 47 with covering barrier layer 24, oxygen 39 is still substantially prevented from passing from the hardmask 23 to the plug 29.

Other materials and method steps can be added or substituted for those above. Thus, although the invention has been described above using particular embodiments, many variations are possible within the scope of the claims, as will be clear to a skilled reader.

We claim:

1. A device, comprising:
   a substrate;
   a ferroelectric capacitor having a ferroelectric layer sandwiched between a top electrode and a bottom electrode, said bottom electrode being disposed on said substrate;
   a hardmask located above said ferroelectric capacitor;
   a contact plug passing through said substrate and electrically connected to said bottom electrode;
   a barrier layer disposed on a surface of said bottom electrode; and
   a sidewall oxygen diffusion barrier extending from said hardmask to said barrier layer and forming an oxygen-tight seal with said barrier layer, thereby reducing the diffusion of oxygen from said hardmask to said plug.

2. The device of claim 1, wherein said substrate is comprised of an HCD Nitride, and said sidewall oxygen diffusion barrier is an HCD Nitride fence formed from said substrate.

3. The device of claim 1, further comprising an additional barrier layer that covers said hardmask, said additional barrier layer forming an additional oxygen-tight seal with said sidewall oxygen diffusion barrier.

4. The device of claim 3, wherein prior to covering said hardmask with said additional barrier layer, said sidewall oxygen diffusion barrier is formed by depositing an oxygen stopping cover layer over outer portions of said device and then anisotropically etching said oxygen stopping cover layer so that only sidewall portions remain.

5. The device of claim 3, wherein said sidewall oxygen diffusion barrier is comprised of a nitride or $Al_2O_3$.

6. The device of claim 3, wherein said sidewall oxygen diffusion barrier is disposed between a sidewall of said bottom electrode and said additional barrier layer.

7. The device of claim 1, wherein said hardmask includes a CW hole that extends through said hardmask, the oxygen being introduced into said hardmask during formation of the CW hole.

8. The device of claim 7, wherein the CW hole extends to said top electrode of said ferroelectric capacitor to allow for an electrical connection to said top electrode of said ferroelectric capacitor.

9. The device of claim 1, wherein said barrier layer is comprised of iridium (Ir) or iridium oxide ($IrO_2$).

10. The device of claim 1, wherein said hardmask is comprised of TEOS.

11. The device of claim 1, further comprising a further hardmask that is disposed atop said top electrode.

12. The device of claim 11, further comprising a further barrier layer that is disposed between said hardmask and said further hardmask.

* * * * *